United States Patent [19]

Klank et al.

[11] 4,348,771

[45] Sep. 7, 1982

[54] DIGITAL TUNING SYSTEM FOR A RADIO RECEIVER

[75] Inventors: Otto Klank, Arpke; Dieter Rottmann, Hanover; Helmut Wössner, Ronnenberg, all of Fed. Rep. of Germany

[73] Assignee: Licentia Patent-Verwaltungs-G.m.b.H., Frankfurt am Main, Fed. Rep. of Germany

[21] Appl. No.: 81,383

[22] Filed: Oct. 3, 1979 (Under 37 CFR 1.47)

[30] Foreign Application Priority Data

Oct. 4, 1978 [DE] Fed. Rep. of Germany ....... 2843214

[51] Int. Cl.³ .............................................. H04B 1/16
[52] U.S. Cl. .................................... 455/180; 455/169; 455/185; 455/188; 455/192
[58] Field of Search ............... 455/150, 169, 161, 166, 455/173, 175, 176, 177, 179, 185, 180, 182, 188, 184, 192, 158, 200, 186, 266; 358/191.1, 192.1, 193.1

[56] References Cited

U.S. PATENT DOCUMENTS

| | | | |
|---|---|---|---|
| 3,961,266 | 6/1976 | Tanaka | 455/182 |
| 3,965,336 | 6/1976 | Grohmann | 455/169 |
| 3,988,681 | 10/1976 | Schurmann | 455/161 |
| 4,075,567 | 2/1978 | Klank | 455/180 |
| 4,077,009 | 2/1978 | Klank | 455/184 |
| 4,110,695 | 8/1978 | Klank | 455/180 |

FOREIGN PATENT DOCUMENTS

2703861 8/1978 Fed. Rep. of Germany .

OTHER PUBLICATIONS

PLL-Synthexizer mit Mikrocomputer, by Willy Kanow, Radio Mentor Electronics, 1978, No. 4, pp. 136-138.
Digitale Senderwahl und Suchlaufautomatik fur UKW-Empfanger, by Helmut Herfel, "Funkschau", 1974, No. 2, pp. 62-63.

*Primary Examiner*—Tommy P. Chin
*Attorney, Agent, or Firm*—Spencer & Kaye

[57] ABSTRACT

In a digital tuning system for a radio receiver, which system includes a station memory having a plurality of memory locations for storing digit representations identifying respective broadcast frequencies to be received, a plurality of station selector elements each connected to be actuatable for addressing a respective memory location to cause the tuning system to tune the receiver to the station identified by the representations stored in the addressed memory location, a plurality of band selector elements each connected to be actuatable for causing the receiver to be tuned within a respective signal band, and components operable for continuously varying the receiving frequency to which the receiver is tuned, the station memory is provided with a plurality of additional memory locations and each band selector element is connected to address, upon being actuated, a respective additional memory location to cause the tuning system to tune the receiver to the station identified by representations stored in the addressed additional memory location, the additional memory locations not being addressable by the station selector elements.

9 Claims, 1 Drawing Figure

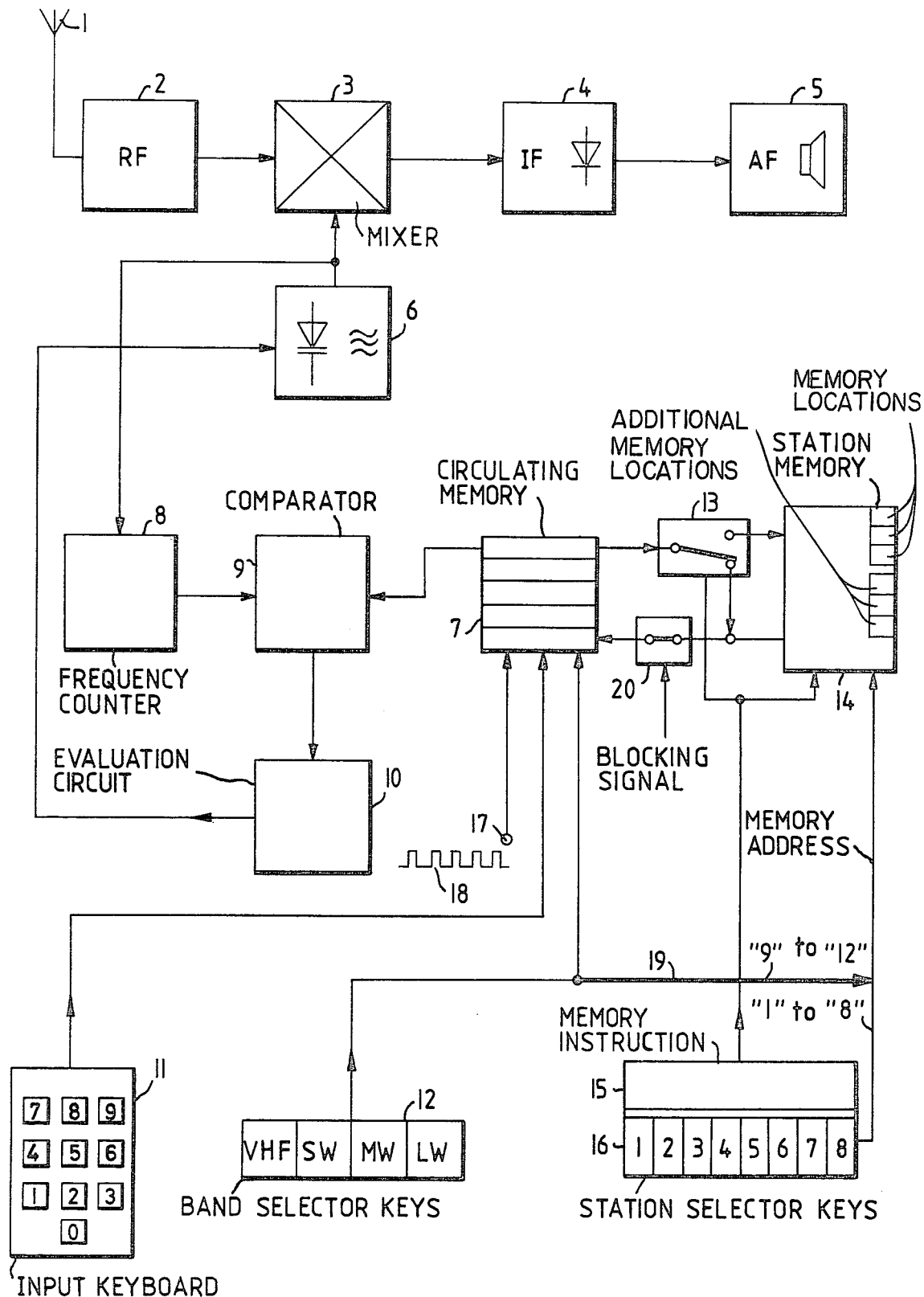

DIGITAL TUNING SYSTEM FOR A RADIO RECEIVER

BACKGROUND OF THE INVENTION

Known digital tuning systems, such as disclosed, for example, in "Radio Mentor Electronic" 1978, No. 4, pages 136-138, make it possible to tune a receiver by feeding in the digits of a receiving frequency or transferring a stored number representing the receiving frequency into the tuning system and to effect quasi-continuous tuning by the input of pulses which are counted in a counter forming part of the tuning system. The tuning process is controlled in dependence upon the counter position, or count state. In the tuning system disclosed in the above-mentioned publication, such continuous tuning with pulses is provided for manual tuning as well as for station search operation.

In such a tuning system, manual tuning may be effected, for example, in that starting with the existing tuning position, the receiving frequency is changed upwardly or downwardly depending on the direction of rotation of a manual tuning knob which generates the pulses.

There then exists the problem in such manual, continuous tuning, when changing from one tuning range to another, that a receiving frequency may be set which lies outside the receiving frequency range. In the known tuning system, such a situation is handled by causing a frequency indicator to emit a visual blinking signal. By calling up a stored station or puting in a receiving frequency, a frequency can be set within the tuning range and continuous tuning can then be effected from that frequency.

SUMMARY OF THE INVENTION

It is an object of the present invention to provide a tuning system with manual tuning which is as easy as possible to manipulate.

This and other objects are achieved, according to the invention, in a digital tuning system for a radio receiver, which system includes a station memory having a plurality of memory locations for storing digit representations identifying respective broadcast frequencies to be received, a plurality of station selector elements each connected to be actuatable for addressing a respective memory location to cause the tuning system to tune the receiver to the station identified by the representations stored in the addressed memory location, a plurality of band selector elements each connected to be actuatable for causing the receiver to be tuned within a respective signal band, and means operable for continuously varying the receiving frequency to which the receiver is tuned, by providing the station memory with a plurality of additional memory locations and connecting each band selector element to address, upon being actuated, a respective additional memory location to cause the tuning system to tune the receiver to the station identified by representations stored in the addressed additional memory location, the additional memory locations not being addressable by the station selector elements.

The present invention can be used to advantage particularly for all digital tuning systems in which, in addition to tuning by stored identifying values, manual continuous variation of tuning in the sense of conventional manual tuning is also provided.

BRIEF DESCRIPTION OF THE DRAWING

The sole FIGURE is a block circuit diagram illustrating a preferred embodiment of the invention in the form of a digital tuning system.

DESCRIPTION OF THE PREFERRED EMBODIMENTS

At the top of the FIGURE there is shown the relevant components of a superheterodyne receiver including an antenna 1, a preliminary RF stage 2, a mixer stage 3, an intermediate frequency amplifier and demodulator 4 and an audio frequency amplifier and loudspeaker 5. The mixer stage 3 receives the output signal from a superheterodyne oscillator 6 which is part of the tuning circuit shown in the lower portion of the FIGURE.

This tuning includes an electronic frequency counter 8 which periodically determines the frequency to which the receiver is tuned by periodically counting the oscillations at the output of the superheterodyne oscillator 6 while taking account of the intermediate frequency value, and an input memory in the form of a circulating memory 7 into a desired receiving frequency value can be fed from an input keyboard 11 and stored. The contents of the cirulating memory 7 and the measuring result produced by the frequency counter 8 are compared with one another in a comparator 9. As described in detail in U.S. Pat. No. 4,110,695, the corresponding digit positions of the numbers representing the frequency values are compared sequentially in time by a time multiplex operation. It is also possible, as described in "Funkschau" 1974, No. 2, at pages 62-63, to construct a circuit in such a manner that the comparison is made simulataneously for all digit positions.

An evaluation circuit 10 is connected to the output of the comparator 9. The structure and operation of such an evaluation circuit is disclosed in detail in German Offenlegungsschrift [Laid-open application] No. 2,625,741 as well as in U.S. Pat. No. 4,110,695. The output signal of the evaluation circuit 10 is used to control the superheterodyne oscillator 6 in a manner to bring the contents of the frequency counter 8 into coincidence with the contents of the circulating memory 7.

The circulating memory 7 stores a representation of the receiving frequency as well as information about the receiving band in which the stored receiving frequency is located. Identification of the selected receiving band is fed into the circulating memory 7 from a band selector keyboard 12. During the comparison procedure which continues uninterruptedly during the receiving operation, the stored information circulates in the circulating memory 7 with the content of the uppermost stage of the circulating memory 7, as shown in the drawing, being returned, via a path defined by a switch 13 when in the illustrated position, to the lowermost stage.

A station memory 14 is provided in which digital signals representing frequencies and bands of several selected stations can each be stored in respective memory locations. The sequence of storing and the readout of stored data are disclosed in detail in U.S. Pat. No. 4,075,567, which describes these operations to the extent required to understand the invention. By actuating a memory instruction key 15, the switch 13 is brought into its nonillustrated position and the station memory 14 is enabled to store the current contents of the circulating memory 7. Then the station memory location in which the contents of the circulating memory are to be stored is selected by actuating one of the station selector keys 16. Thus keys 16 address the memory locations. The addresses for the memory locations may be, for example, the numbers "1" through "8" in binary form. After completion of storing the contents of the circulating memory 7, release of key 15 allows switch 13 to switch back into its illustrated position.

If one of the memory location selection, or station selector, keys 16 is actuated without prior actuation of the memory instruction key 15, the station memory 14 is again switched to transfer data to the circulating memory 7 and the stored data of the memory location selected by that key are transferred into the circulating memory 7. In this way, if there is a corresponding number of memory locations, any number of different, fixed receiving frequencies can be selected by actuating only one key at a time.

In addition to the two ways of feeding data representing a receiving frequency into the tuning system, there is also provided the possibility of continuous manual tuning. One manner in which such manual tuning can be effected by means of the circulating memory 7 is described in German Offenlegungsschrift [Laid-open application] No. 2,703,861. For continuous tuning, the circulating memory 7 is initially switched to operate as a counter. As indicated in the drawing the circulating memory 7 when switched to act as a counter receives pulses 18 at terminal 17 which quasi-continuously vary the tuning in very small increments. The state of the counter is thereby changed either upwardly or downwardly starting from the previously existing contents of the circulating memory 7.

When switching from one receiving band to another, e.g. from the VHF band to the medium wave band, there exists the problem that the receiving frequency stored in circulating memory 7 may not fit into the switched-in receiving band. Then there exists no tuning position from which continuous tuning can proceed.

The following measures according to the invention make it possible, whenever a receiving range has been switched on, to automatically set a defined starting position for manual, continuous tuning:

The station memory 14 is provided with memory locations which cannot be called up by the selector keys 16. These memory locations, for example, have the addresses 9 through 12 in binary form. Each receiving band is associated with a respective one of these special memory locations, e.g. the VHF band with the location having the address 9, the MW band with the memory location having the address 10, etc. When a band selector key 12 is actuated, a binary code word is formed each time which is stored in the circulating memory 7 as band information. There also exists a connection from the output line from the band selector keys 12 to the addressing input of the station memory 14. This connection is shown in the drawing by a heavier line 19. In this circuit, the band selector keys 12 call up a memory location in the same manner as do the keys 16 so that a stored receiving frequency is transferred into the circulating memory 7 in the manner already described above. Thus, the keys 12 are equivalent, with respect to the call-up of stored receiving frequencies, to the memory location selection keys 16.

Any desired receiving frequency in the respective receiving band, e.g. in the center of the band, at the beginning of the band, or a preferred station, can be stored in the memory location assigned to the particular receiving band. The band selector keys 12 are also equivalent to the keys 16 with respect to storage of receiving data present in circulating memory 7. A selected receiving frequency including the information about its receiving band can thus be stored in the manner described for keys 16, by actuation of the memory instruction key 15 and the band selector key (e.g. VHF) in connection with which, the receiving frequency is to be stored. When this is done, data circulating in memory 7 and identifying a particular frequency and band is fed into the location of memroy 14 which is addressed by the actuated band selector key. It is also possible to design the memory locations assigned to the receiving bands as memories with fixed, nonerasable contents.

In the circuit described in connection with the drawing the following operating error may occur: a manually selected station in a selected band (e.g. the MW band) is to be stored as the preferred station for this band. But now, to initiate the storage process, the key designating another band (e.g. the SW band) is depressed inadvertently instead of the key associated with the selected band. The band information thus stored at the memory location associated with the key which was actually depressed in thus information which belongs to a different band. As a result of this operating error it could happen that another nonselected band is switched on after the selection of a certain band. In the above example the MW band would be switched on after the key for switching the SW band is depressed.

In order to eliminate the last described shortcoming, the present invention advantageously provides, in the path from the station memory 14 output to the circulating memory 7 input, a blocking device 20 which blocks this signal path during a phase in time when the band information is being put out by the station memory 14. In this way it is prevented that the band information stored in memory 14 can be transferred to memory 14 upon actuation of one of the band selector keys 12. Instead, the information provided by the actually depressed band selector key 12 is transferred to the circulating memory 7. The operator will then notice the error because no suitable frequency will have been stored for the actually selected band.

It will be understood that the above description of the present invention is susceptible to various modifications, changes and adaptations, and the same are intended to be comprehended within the meaning and range of equivalents of the appended claims.

What is claimed is:

1. In a digital tuning system for a radio receiver, which system includes a station memory having a plurality of memory locations for storing digit representations identifying respective broadcast frequencies to be received, a plurality of station selector elements each connected to be manually actuatable for addressing a respective memory location to cause the tuning system to tune the receiver to the broadcast frequency identified by the representations stored in the addressed memory location, and a plurality of band selector elements each connected to be manually actuatable for causing the receiver to be tuned within a respective signal band, the improvement wherein said station memory comprises a plurality of additional memory locations each storing a digit representation of a selected broadcast frequency in a respective signal band, and each said band selector element is connected to address, upon being actuated, a respective additional memory location to cause the tuning system to tune the receiver to the broadcast frequency identified by representations stored in a said additional memory location when addressed by an actuated band selector element, said additional memory locations not being addressable by said station selector elements.

2. Tuning system as defined in claim 1 further comprising means responsive to manual actuation of any one of said band selector elements for forming a code word which identifies the additional memory location addressed by said one band selector element and for feeding that code word to said station memory as an address code.

3. Tuning system as defined in claim 1 further comprising a manually actuatable memory instruction element operatively connected to said station memory, and means causing concurrent actuation of said memory instruction element and of a respective one of said band selector elements to effect reading of a representation identifying a selected broadcast frequency into that additional memory location associated with the respective band selector element.

4. Tuning system as defined in claim 1 wherein each said additional memory location contains a permanently stored, nonerasable broadcast frequency representation.

5. Tuning system as defined in claim 4 wherein the permanently stored frequency representation stored in at least one of said additional memory locations identifies a frequency at the beginning of the respective signal band with which that additional memory location is associated.

6. Tuning system as defined in claim 4 wherein the permanently storerd frequency representation stored in at least one of said additional memory locations identifies a frequency at the center of the respective signal band with which that additional memory location is associated.

7. Tuning system as defined in claim 1 wherein each additional memroy location of said station memory is arranged to store digit representations identifying the frequency value and the band of a respective station to which the receiver is to be tuned, and further comprising means connected to said station memory and said band selector elements and responsive to actuation of a respective band selector element for causing tuning to be effected in response to the digit representations identifying only the frequency value stored in the additional location associated with the respective band selector element and to band identification information produced by actuation of the respective band selector element.

8. Tuning system as defined in claim 7 wherein said means connected to said station memory and said band selector elements act to block read-out of digital representations identifying the band stored in the additional memory location associated with the respective band selector element.

9. Tuning system as defined in claim 7 wherein said means connected to said station memory and said band selector elements act to cover the digital representations identifying the band read out from the additional memory location associated with the respective band selector element with the band identification information produced by actuation of the respective band selector element.

* * * * *